(12) United States Patent
Hatakeyama et al.

(10) Patent No.: US 8,198,176 B2
(45) Date of Patent: Jun. 12, 2012

(54) METHOD FOR PRODUCING SEMICONDUCTOR CHIP WITH ADHESIVE FILM, ADHESIVE FILM FOR SEMICONDUCTOR USED IN THE METHOD, AND METHOD FOR PRODUCING SEMICONDUCTOR DEVICE

(75) Inventors: Keiichi Hatakeyama, Tsukuba (JP); Yuuki Nakamura, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/682,254

(22) PCT Filed: Oct. 7, 2008

(86) PCT No.: PCT/JP2008/068237
§ 371 (c)(1),
(2), (4) Date: Aug. 26, 2010

(87) PCT Pub. No.: WO2009/048061
PCT Pub. Date: Apr. 16, 2009

(65) Prior Publication Data
US 2010/0311227 A1    Dec. 9, 2010

(30) Foreign Application Priority Data
Oct. 9, 2007  (JP) .............................. P2007-263347

(51) Int. Cl.
*H01L 21/00* (2006.01)
(52) U.S. Cl. ..................................... 438/464
(58) Field of Classification Search .................. 438/464
See application file for complete search history.

(56) References Cited

U.S. PATENT DOCUMENTS
6,465,330 B1 * 10/2002 Takahashi et al. ............ 438/464
(Continued)

FOREIGN PATENT DOCUMENTS
JP     2002-016021    1/2002
(Continued)

OTHER PUBLICATIONS

Chinese Official Action issued Mar. 24, 2011, for CN Application No. 200880110828.5.

(Continued)

*Primary Examiner* — N Drew Richards
*Assistant Examiner* — Grant Withers
(74) *Attorney, Agent, or Firm* — Antonelli, Terry, Stout & Kraus, LLP.

(57) ABSTRACT

The method for producing a semiconductor chip with an adhesive film of the present invention comprises steps of preparing a laminate in which at least a divided semiconductor wafer comprising a plurality of semiconductor chips, obtained by forming a cut which separates the semiconductor wafer into a plurality of semiconductor chips on one side of the semiconductor wafer in a thickness less than that of the semiconductor wafer and by grinding the other side of the semiconductor wafer on which no cut is formed to reach the cut, an adhesive film for a semiconductor and a dicing tape are laminated, the adhesive film for a semiconductor having a thickness in the range of 1 to 15 μm and a tensile elongation at break of less than 5%, and the tensile elongation at break being less than 110% of the elongation at a maximum load; and dividing the adhesive film for a semiconductor by picking up the plurality of semiconductor chips in a laminating direction of the laminate, thereby preparing a semiconductor chip with an adhesive film.

8 Claims, 6 Drawing Sheets

U.S. PATENT DOCUMENTS

| | | | |
|---|---|---|---|
| 6,551,906 B2* | 4/2003 | Oka | 438/465 |
| 6,680,241 B2* | 1/2004 | Okamoto et al. | 438/464 |
| 6,756,288 B1* | 6/2004 | Feil et al. | 438/464 |
| 6,827,636 B2* | 12/2004 | Yamada | 451/65 |
| 6,919,262 B2* | 7/2005 | Senoo et al. | 438/464 |
| 6,939,785 B2* | 9/2005 | Kajiyama et al. | 438/463 |
| 7,323,397 B2* | 1/2008 | Lee et al. | 438/458 |
| 7,517,724 B2* | 4/2009 | Hatakeyama et al. | 438/114 |
| 7,550,367 B2* | 6/2009 | Tamura et al. | 438/463 |
| 7,563,642 B2* | 7/2009 | Higashino | 438/113 |
| 7,578,891 B2* | 8/2009 | Ookubo et al. | 148/33.3 |
| 7,585,701 B2* | 9/2009 | Beer et al. | 438/118 |
| 7,923,351 B2* | 4/2011 | Arita | 438/463 |
| 2002/0195687 A1* | 12/2002 | Brooks et al. | 257/632 |
| 2004/0082149 A1* | 4/2004 | Sakaguchi et al. | 438/458 |
| 2005/0009298 A1* | 1/2005 | Suzuki et al. | 438/459 |
| 2005/0179127 A1 | 8/2005 | Takyu et al. | |
| 2006/0128065 A1* | 6/2006 | Inada et al. | 438/118 |
| 2006/0166466 A1* | 7/2006 | Maki et al. | 438/464 |
| 2006/0197260 A1* | 9/2006 | Yoshikawa et al. | 264/482 |
| 2007/0026572 A1* | 2/2007 | Hatakeyama et al. | 438/113 |
| 2007/0059903 A1* | 3/2007 | Yano et al. | 438/459 |
| 2007/0241436 A1* | 10/2007 | Ookubo et al. | 257/678 |
| 2008/0210955 A1* | 9/2008 | Uemura et al. | 257/88 |
| 2010/0099240 A1* | 4/2010 | Watanabe et al. | 438/464 |
| 2010/0112783 A1* | 5/2010 | Nakamura et al. | 438/458 |
| 2010/0120229 A1* | 5/2010 | Nakamura et al. | 438/464 |
| 2010/0233867 A1* | 9/2010 | Akiyama et al. | 438/464 |
| 2010/0261314 A1* | 10/2010 | Takamoto et al. | 438/114 |
| 2010/0267199 A1* | 10/2010 | Hatakeyama et al. | 438/107 |
| 2010/0291739 A1* | 11/2010 | Hong et al. | 438/124 |
| 2010/0311227 A1* | 12/2010 | Hatakeyama et al. | 438/464 |
| 2011/0021005 A1* | 1/2011 | Inada et al. | 438/464 |
| 2011/0104873 A1* | 5/2011 | Kamiya et al. | 438/464 |

FOREIGN PATENT DOCUMENTS

| | | |
|---|---|---|
| JP | 2002-367933 | 12/2002 |
| JP | 2003-017513 | 1/2003 |
| JP | 2006-086509 | 3/2006 |
| JP | 2006-203133 | 8/2006 |
| JP | 2007-019151 | 1/2007 |
| WO | WO 2008/126718 | 10/2008 |

OTHER PUBLICATIONS

Translation of the International Preliminary Report on Patentability mailed May 20, 2010, for Application No. PCT/JP2008/068237, filed Oct. 7, 2008.

English translation of Chinese Official Action issued Mar. 24, 2011, for CN Application No. 200880110828.5. (Translation only).

Extended European Search Report dated Nov. 9, 2011, including Supplementary European Search Report and European Search Opinion, for EP Application No. 08837752.8-2203/2200074 (PCT/JP2008/068237).

* cited by examiner

METHOD FOR PRODUCING SEMICONDUCTOR CHIP WITH ADHESIVE FILM, ADHESIVE FILM FOR SEMICONDUCTOR USED IN THE METHOD, AND METHOD FOR PRODUCING SEMICONDUCTOR DEVICE

TECHNICAL FIELD

The present invention relates to a method for producing a semiconductor chip with an adhesive film, an adhesive film for a semiconductor used in the method and a method for producing a semiconductor device.

BACKGROUND ART

Heretofore, silver paste has been mainly used for bonding a semiconductor chip and a semiconductor chip mounting support member. However, with the downsizing and high performance of semiconductor chips and the downsizing and miniaturization of support members used, some problems have arisen with the method using silver paste, such as the occurrence of failures in wire bonding caused by the extrusion of paste or inclined semiconductor chips, the difficulty in controlling the film thickness of adhesive layers and the generation of voids in adhesive layers. Also, in the field of mobile devices where further miniaturization and a higher density are required, semiconductor devices in which a plurality of semiconductor chips are laminated have been developed and mass-produced, and the above problems tend to become apparent particularly when such semiconductor devices are produced. For the above reasons, film adhesives (hereinafter referred to as an adhesive film for a semiconductor) have been recently used instead of silver paste.

Examples of methods of producing a semiconductor device using an adhesive film for a semiconductor include: (1) a piece lamination process in which an adhesive film for a semiconductor which has been cut in any size is laminated on a semiconductor chip mounting support member such as a wiring board or a semiconductor chip, and a semiconductor chip is bonded thereto by thermocompression bonding; and (2) a wafer back-side lamination process, in which an adhesive film for a semiconductor is laminated on the back side of a semiconductor wafer and the resultant is cut into pieces with a rotary blade to prepare a semiconductor chip with an adhesive film, and the chip is bonded to a semiconductor chip mounting support member or a semiconductor chip by thermocompression bonding. Recently, to simplify the production process of semiconductor devices, the wafer back-side lamination process described in the above (2) has become the mainstream.

In the wafer back-side lamination process, it has been common to cut a semiconductor wafer on which an adhesive film for a semiconductor is laminated with a rotary blade as described above. However, cutting a semiconductor wafer and an adhesive film simultaneously by a general dicing method using a rotary blade has had the problem of the occurrence of cracks (chip cracks) at the edge of the semiconductor chip after cutting or the occurrence of much flash due to the rough section of the adhesive film. The presence of such chip cracks and flash makes it easier for semiconductor chips to be broken when they are picked up. In particular, picking up semiconductor chips cut from a thinned semiconductor wafer without cracks becomes difficult.

So recently methods have been proposed, in which a street for partitioning formed on the surface of a semiconductor wafer is cut so as to form a dicing groove and the back side of the wafer is ground to reach the bottom of the dicing groove, thereby dividing the semiconductor wafer into semiconductor chips (see, for example, Patent Documents 1 and 2). And the following methods are for forming an adhesive film having the same size as a semiconductor chip prepared by such a dicing-before-grinding process on the back side of the semiconductor chip.

(a) A method including preparing a laminate of a semiconductor wafer (a plurality of semiconductor chips) divided by a dicing-before-grinding process, an adhesive film for a semiconductor and a dicing tape, and dividing the adhesive film for a semiconductor by expanding the dicing tape by an expanding device.

(b) A method including preparing a laminate of a semiconductor wafer (a plurality of semiconductor chips) divided by a dicing-before-grinding process and an adhesive film for a semiconductor, and cutting the adhesive film for a semiconductor with a laser dicer along a street (diced line) on the wafer surface.

Patent Document 1: Japanese Patent Application Laid-Open No. 2002-016021
Patent Document 2: Japanese Patent Application Laid-Open No. 2002-367933

DISCLOSURE OF THE INVENTION

However, the above method (a) requires a separate expanding device and has the problem of the occurrence of film extension from chip ends or extrusion of flash or the like when dividing the adhesive film for a semiconductor. Further, the above method (b) requires a separate laser dicing device and needs an identification procedure for each line so as to deal with the shift of streets (kerf shift), and so cutting an adhesive film for a semiconductor efficiently in a short time is difficult. As described above, even when employing a dicing-before-grinding process for producing a semiconductor device, further improvement is necessary for dividing an adhesive film in order to achieve both assembling properties and reliability.

The present invention has been made in view of the above-described circumstances and an object of the present invention is to provide a method for producing a semiconductor chip with an adhesive film, capable of producing a semiconductor chip from a semiconductor wafer at a good yield and capable of producing a semiconductor chip with an adhesive film laminated thereon in which flash is sufficiently little and which has substantially the same shape as that of the semiconductor chip, an adhesive film for a semiconductor suitably used in the method for producing a semiconductor chip with an adhesive film, and a method for producing a semiconductor device capable of achieving both assembling properties and reliability.

To solve the above problems, the method for producing a semiconductor chip with an adhesive film of the present invention comprises steps of: preparing a laminate in which at least a divided semiconductor wafer comprising a plurality of semiconductor chips, obtained by forming a cut which separates the semiconductor wafer into a plurality of semiconductor chips on one side of the semiconductor wafer in a thickness less than that of the semiconductor wafer and by grinding the other side of the semiconductor wafer on which no cut is formed to reach the cut, an adhesive film for a semiconductor and a dicing tape are laminated, the adhesive film for a semiconductor having a thickness in the range of 1 to 15 μm and a tensile elongation at break of less than 5%, and the tensile elongation at break being less than 110% of the elongation at a maximum load; and dividing the adhesive film for a semiconductor by picking up the plurality of semiconductor chips in a laminating direction of the laminate, thereby preparing a semiconductor chip with an adhesive film.

According to the method for producing a semiconductor chip with an adhesive film of the present invention, by combining a dicing-before-grinding process and the above-described specific adhesive film for a semiconductor, and by dividing the adhesive film for a semiconductor using the shearing force generated when picking up semiconductor chips, a semiconductor chip can be produced from a semiconductor wafer at a good yield, and a semiconductor chip with an adhesive film laminated thereon in which flash is sufficiently little and which has substantially the same shape as that of the semiconductor chip can be easily prepared.

When the thickness of an adhesive film for a semiconductor is less than 1 μm, preparing the adhesive film becomes difficult, and when the thickness is more than 15 μm, dividing the adhesive film for a semiconductor by picking up of semiconductor chips becomes difficult. When the adhesive film for a semiconductor has a tensile elongation at break of 5% or more, the amount of expansion of the dicing tape needs to be made greater than usual. When the ratio of the tensile elongation at break to the elongation at the maximum load is 110% or more, completely dividing the adhesive film for a semiconductor with preventing flash from occurring becomes difficult, and so preparing an adhesive film suited to the shape of semiconductor chips becomes difficult.

The method for producing a semiconductor device of the present invention includes a step of bonding the semiconductor chip with an adhesive film obtained by the method for producing a semiconductor chip with an adhesive film of the present invention to another semiconductor chip or a semiconductor chip mounting support member.

The method for producing a semiconductor device of the present invention makes it possible to achieve both assembling properties and reliability by using a semiconductor chip with an adhesive film obtained by the method for producing a semiconductor chip with an adhesive film of the present invention.

The present invention also provides an adhesive film for a semiconductor used in the method for producing a semiconductor chip with an adhesive film of the present invention, which has a thickness in the range of 1 to 15 μm and a tensile elongation at break of less than 5%, and in which the tensile elongation at break is less than 110% of the elongation at the maximum load.

EFFECT OF THE INVENTION

The present invention can provide a method for producing a semiconductor chip with an adhesive film, capable of producing a semiconductor chip from a semiconductor wafer at a good yield and capable of producing a semiconductor chip with an adhesive film laminated thereon in which flash is sufficiently little and which has substantially the same shape as that of the semiconductor chip, an adhesive film for a semiconductor suitably used in the method for producing a semiconductor chip with an adhesive film and a method for producing a semiconductor device capable of achieving both assembling properties and reliability.

BEST MODES FOR CARRYING OUT THE INVENTION

Figure 1:
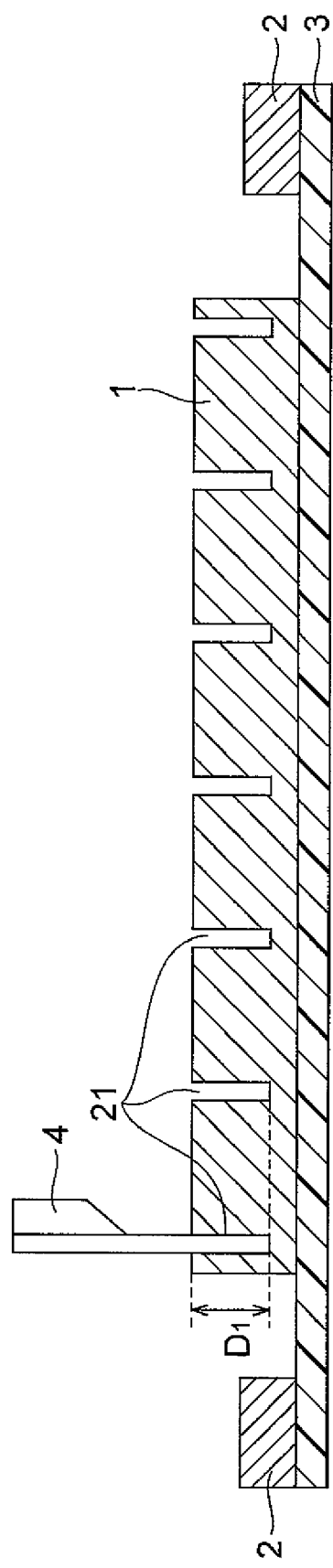
FIG. 1 is a schematic cross-sectional view illustrating a method for producing a semiconductor chip with an adhesive film according to an embodiment.

Hereinafter preferred embodiments of the present invention will be described in detail.

FIGS. 1, 2, 3, 4 and 5 are schematic cross-sectional views illustrating a preferred embodiment of a method for producing a semiconductor chip with an adhesive film of the present invention. The method for producing a semiconductor chip with an adhesive film according to this embodiment comprises a first step (FIG. 1) of forming a cut 21 which separates a semiconductor wafer 1 into a plurality of semiconductor chips on one side of the semiconductor wafer 1 (side on which a circuit is formed) to a depth D1 which is less than the thickness of the semiconductor wafer and deeper than a final finished thickness, a second step (FIG. 2) of preparing a divided semiconductor wafer 7 comprising a plurality of semiconductor chips by grinding the other side of the semiconductor wafer on which no cut is formed to the final finished thickness to reach the cut 21, a third step (FIG. 3) of preparing a laminate 20 in which the divided semiconductor wafer 7, an adhesive film 8 for a semiconductor according to the present invention and a dicing tape 3 are laminated in that order, and a fourth step (FIG. 5) of dividing the adhesive film 8 for a semiconductor by picking up the plurality of semiconductor chips 7a in the laminating direction of the laminate with expanding the dicing tape 3 in the direction in which the plurality of semiconductor chips constituting the divided semiconductor wafer 7 are each separated (FIG. 4), thereby preparing a semiconductor chip 30 with an adhesive film. The semiconductor chip 30 with an adhesive film obtained through these steps has an adhesive film 8a in which flash is sufficiently little and which has substantially the same shape as that of the semiconductor chip 7a.

A wafer composed of single crystalline silicon, polycrystalline silicon, various ceramics or compound semiconductors such as gallium arsenide is used as the semiconductor wafer 1.

In the above-described first step, the semiconductor wafer 1 is laminated on the dicing tape 3, and the cut 21 is formed by half-cutting the surface (circuit side) of the semiconductor wafer by a dicing blade 4 to a depth deeper than the intended final finished thickness of the semiconductor chip as shown in FIG. 1. In this embodiment, D1 is preferably 5 to 50 μm larger, more preferably 10 to 30 μm larger than the final finished thickness.

Figure 2:
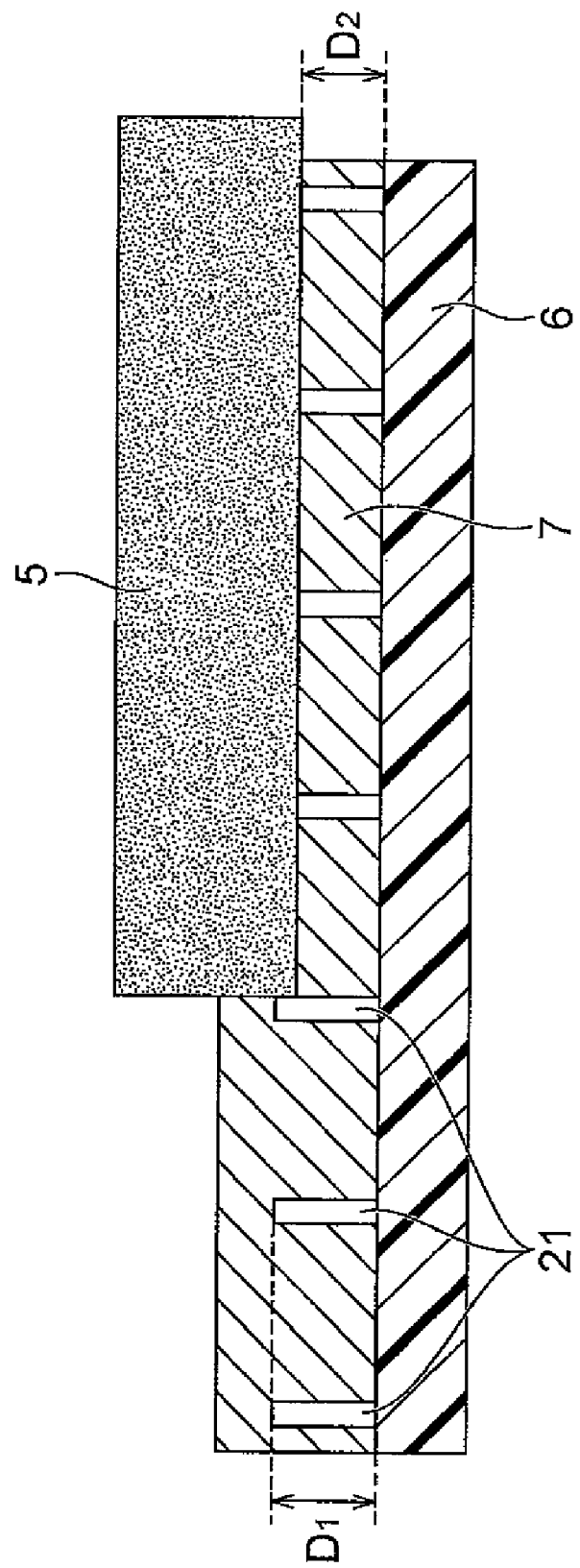
FIG. 2 is a schematic cross-sectional view illustrating a method for producing a semiconductor chip with an adhesive film according to an embodiment.

In the above-described second step, a back grind tape 6 is attached to the side of the semiconductor wafer 1 prepared in the first step on which the cut 21 has been formed, and the side of the semiconductor wafer on which no cut is formed is thinned (back ground) by a back grinding wheel 5 of a back grinding apparatus so that the wafer reaches a predetermined thickness (final finished thickness) D2, thereby preparing the divided semiconductor wafer 7 composed of a plurality of semiconductor chips as shown in FIG. 2.

Fully Automatic Grinder DFG8540 made by DISCO Corporation or the like, for example, may be used as the back grinding apparatus.

Polyethylene terephthalate tapes or the like are used as the back grind tape 6.

In the above-described third step, a laminate 20 is prepared by a method of attaching the adhesive film 8 for a semiconductor and the dicing tape 3 in that order to the back side of the divided semiconductor wafer 7 (the side opposite to the back grind tape 6 side), or a method of attaching a composite sheet in which the adhesive film 8 for a semiconductor and the dicing tape 3 are laminated on the back side of the divided semiconductor wafer 7 in such a direction that the adhesive film 8 for a semiconductor is on the side of the divided semiconductor wafer 7.

Figure 3:
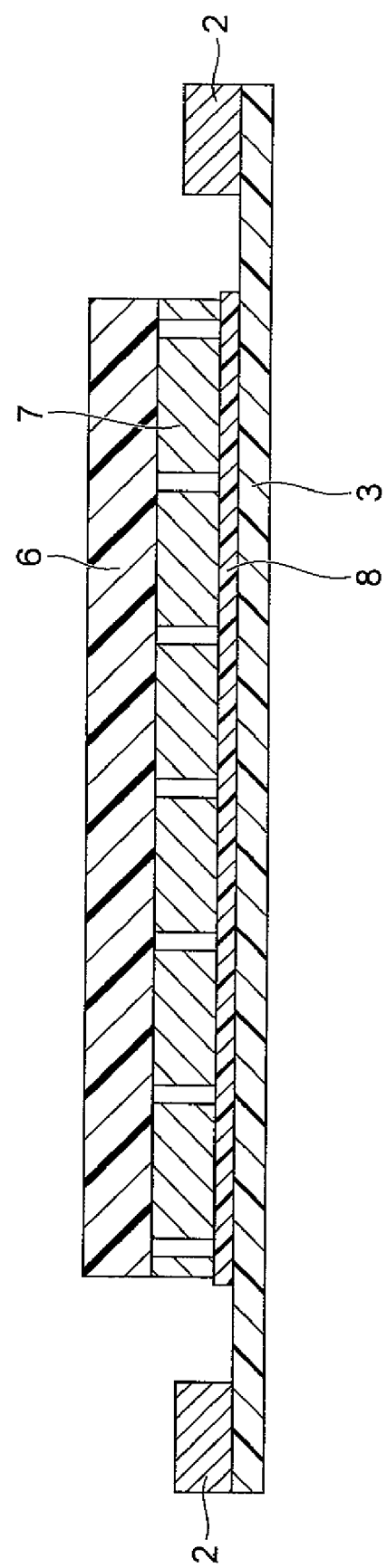
FIG. 3 is a schematic cross-sectional view illustrating a method for producing a semiconductor chip with an adhesive film according to an embodiment.

FIG. 3 illustrates a case where the back grind tape 6 is laminated on the divided semiconductor wafer 7. The back grind tape 6 will be peeled off before the next step. Also, the dicing tape 3 of the laminate 20 shown in FIG. 3 has a wafer ring 2 which is a fixing ring.

Any tape may be used as the dicing tape 3 without particular limitation as long as it has enough adhesiveness to be fixed to the fixing ring and can be expanded to leave an appropriate space between each piece of the divided semiconductor wafer (a plurality of semiconductor chips) 7 upon picking up in the above-described fourth step. For example, vinyl chloride tape may be used as the dicing tape.

Examples of commercially available tapes include "AD-80H" and "T-80MW" (trade names, available from DENKI KAGAKU KOGYO K.K.).

Figure 5:
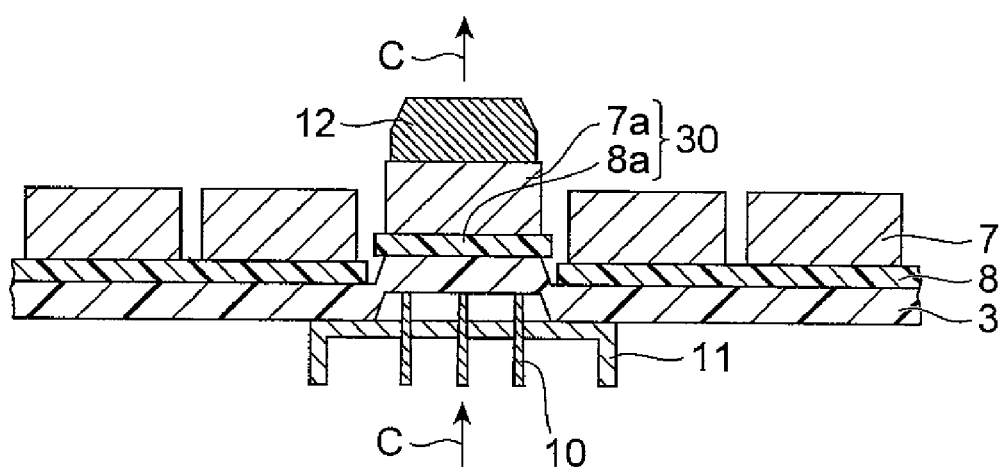
FIG. 5 is a schematic cross-sectional view illustrating a method for producing a semiconductor chip with an adhesive film according to an embodiment.

In the above-described fourth step, the bottom side of the expanded dicing tape 3 is vacuum sucked by a suction dome 11, and the portion where a semiconductor chip to be picked up is located is pushed up by a push-up needle 10, thereby picking up the semiconductor chip 7a by a pick-up collet 12 in the laminating direction of the laminate (the direction of arrow C in FIG. 5). At this stage, a shearing force acts in the thickness direction of the adhesive film 8 for a semiconductor, and the adhesive film 8 is divided in the shape of the semiconductor chip 7a. In this way, a semiconductor chip 30 with an adhesive film 8a laminated thereon in which flash is sufficiently little and which has substantially the same shape as that of the semiconductor chip is produced.

For pick-up systems used in the above-described step, systems developed for thin chips, such as multi-pin push-up systems and three-stage push-up systems, made by Renesas Eastern Japan Semiconductor, Inc. are preferred.

When using the multi-pin push-up system or a usual pin push-up system, pins are preferably disposed near and between the four corners of a chip at regular intervals. In the multi-pin push-up system, in particular, the suction effect from the bottom side of the dicing tape is decreased when too many pins are disposed, and therefore it is preferable to dispose about 9 pins if they have a size of about 10 mm×10 mm.

Also, it is preferred that a pick-up collet 12 for picking up a semiconductor chip has substantially the same size as the chip. For the condition of the pushing up of pins, the push-up height is preferably up to 2000 μm or less, preferably 700 μm or less, more preferably 600 μm or less, and further preferably 500 μm or less. Pushing up to a height of more than 2000 μm is not preferred because the chip may be cracked.

Pins are pushed up at a rate of preferably 20 to 200 mm/s, more preferably 30 to 150 mm/s and further preferably 50 to 100 mm/s. Pushing up at less than 20 mm/s is not preferred because dividing die-bonding film upon pushing up tends to become difficult.

In this embodiment, pushing up may be performed in two or more stages. For example, pins may be pushed up under the conditions of a push-up height of 250 to 1000 μm and a push-up rate of 50 to 100 mm/s in the first stage, and under the conditions of a push-up height of 1000 to 2000 μm and a push-up rate of 1 to 30 mm/s in the second stage.

Figure 4:
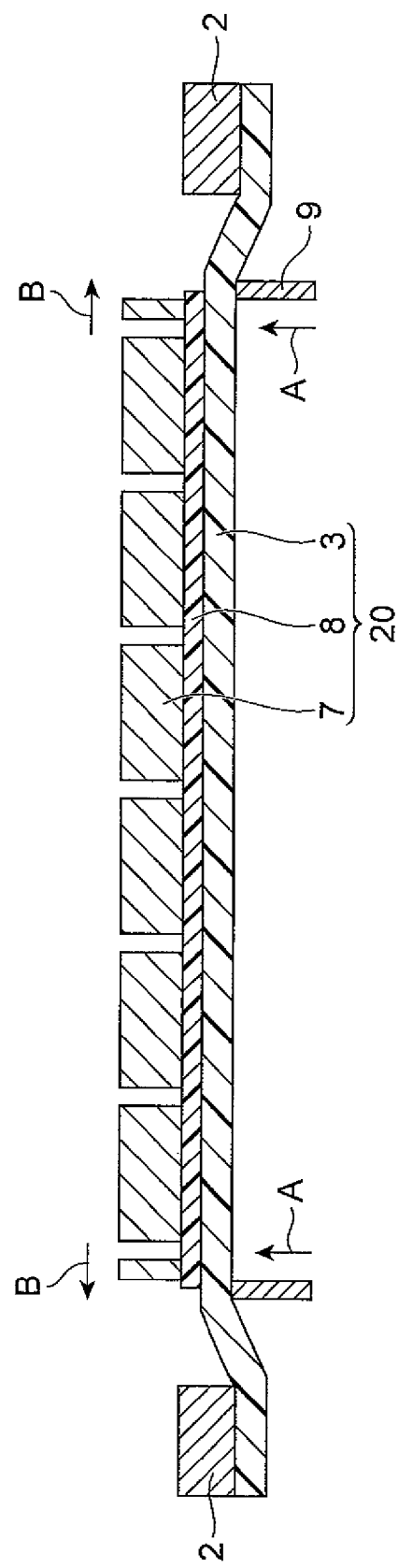
FIG. 4 is a schematic cross-sectional view illustrating a method for producing a semiconductor chip with an adhesive film according to an embodiment.

For expanding the dicing tape 3, by holding up an expand ring 9 from the bottom side of the dicing tape 3 (in the direction of arrow A in FIG. 4), the dicing tape 3 is expanded in such a direction that each piece of the divided semiconductor wafer (a plurality of semiconductor chips) 7 is separated (in the direction of arrow B in FIG. 4). The dicing tape 3 is expanded using a die bonder.

For the amount of expansion of the dicing tape 3, when the dicing tape 3 has an initial maximum width in the range of 200 to 300 mm, the difference between the (maximum) width of the dicing tape 3 after expansion and the (maximum) initial width of the dicing tape 3 is preferably 1 to 20 mm, more preferably 2 to 15 mm, and further preferably 3 to 10 mm.

The amount of expansion of the dicing tape 3 in this embodiment can be smaller than that when cutting a conventional adhesive film for a semiconductor by expansion. Therefore, it is unnecessary to use an additional expanding device.

In this embodiment, by applying the specific adhesive film for a semiconductor of the present invention, an adhesive film 8a in which flash is sufficiently little and which has substantially the same shape as that of the semiconductor chips is separated from the adhesive film for a semiconductor in the above-described pick-up step.

In the following, an adhesive film for a semiconductor according to the present invention will be described.

The adhesive film for a semiconductor according to the present invention has a thickness in the range of 1 to 15 μm and a tensile elongation at break of less than 5%, and the tensile elongation at break is less than 110% of the elongation at the maximum load. Such an adhesive film for a semiconductor is composed of a thermosetting resin and/or a thermoplastic resin.

When the thickness of an adhesive film for a semiconductor is less than 1 μm, preparing the adhesive film becomes difficult, and when the thickness is more than 15 μm, dividing the adhesive film for a semiconductor by picking up of semiconductor chips becomes difficult. When the adhesive film for a semiconductor has a tensile elongation at break of 5% or more, it is necessary to expand the dicing tape in a greater degree than usual. A ratio of a tensile elongation at break to the elongation at the maximum load of 110% or more means long duration of a yielded state or high possibility of the occurrence of necking. In such cases, completely dividing the adhesive film for a semiconductor with preventing flash from occurring becomes difficult, and so preparing an adhesive film suited to the shape of semiconductor chips becomes difficult.

From the above-described reason, the adhesive film for a semiconductor has a tensile elongation at break of preferably less than 4%, more preferably less than 3.5%. Likewise, the ratio of a tensile elongation at break to the elongation at the maximum load is preferably less than 108%, more preferably less than 105%. The ratio is the lowest, 100%, when the tensile elongation at break and the elongation at the maximum load are the same.

The maximum stress, the elongation at the maximum load and the tensile elongation at break are measured by a tensile test at 25° C. using a strip test piece having a width of 5 mm, a length of 50 mm and a thickness of 25 μm cut from a B-stage adhesive film for a semiconductor under the following conditions.
Tensile tester: 100N Autograph "AGS-100NH" made by Shimadzu Corporation
Chuck distance (at start of test): 30 mm
Tensile rate: 5 mm/minute The maximum load, chuck distance at the maximum load and chuck distance at break are read from a stress-strain curve obtained in the tensile test, and using these values and the measured value of the cross-sectional area of a sample, the maximum stress, the elongation at the maximum load and the tensile elongation at break are calculated by the following formula.

Maximum stress (Pa)=maximum load (N)/cross sectional area (m$^2$) of sample

Elongation at maximum load (%)={(chuck distance (mm) at maximum load−30)/30}×100

Tensile elongation at break (%)={(chuck distance (mm) at break−30)/30}×100

Generally, a plurality of test pieces is subjected to measurement and the mean value is recorded as the tensile properties of the adhesive film for a semiconductor. The tensile test is preferably carried out under the above-described conditions in consideration of reproducibility, but they may be changed to other conditions which produce substantially the same test results.

The adhesive film for a semiconductor has a thickness of preferably 3 to 15 μm, more preferably 5 to 15 μm in consideration of the adhesion to an adherend and separability of a film.

The adhesive film 8 for a semiconductor preferably contains a high molecular weight component, a thermosetting component and a filler. By using these components to prepare an adhesive film 8 for a semiconductor and adjusting the types of components and their amounts, an adhesive film 8 for a semiconductor having the above-described specific tensile properties can be produced. Thermoplastic resins are preferred as the high molecular weight component.

The high molecular weight component constituting the adhesive film for a semiconductor preferably has a glass transition temperature (Tg) of 60° C. or lower. Also, a high molecular weight component having a heat resistance of 300° C. or higher is preferred. Examples of preferred high molecular weight components include polyimide resins, polyamide imide resins, phenoxy resins, acrylic resins, polyamide resins and urethane resins. These may be used alone or in combination of two or more. Of them, polyimide resins are particularly preferred. Using a polyimide resin allows the adhesive film 8 for a semiconductor to have the tensile properties as described above with maintaining a reasonably small filler content.

Thermosetting components mean those which can be formed into a cured product by crosslinking by heating, and are composed of, for example, a thermosetting resin and a curing agent therefor. Thermosetting resins are not particularly limited and conventionally known resins may be used. Of them, in consideration of the convenience for peripheral materials of semiconductors (availability of high purity products, diversity of products and easily controllable reactivity), epoxy resins and imide compounds having at least 2 thermosetting imide groups in a molecule are preferred. Epoxy resins are generally used together with an epoxy resin curing agent.

Epoxy resins preferably contain 2 or more epoxy groups. In consideration of curing properties and properties of cured products, phenol glycidyl ether epoxy resins are preferred. Examples of phenol glycidyl ether epoxy resins include condensates of bisphenol A, bisphenol AD, bisphenol S, bisphenol F or halogenated bisphenol A and epichlorohydrin, glycidyl ether of phenol novolac resin, glycidyl ether of cresol novolac resin and glycidyl ether of bisphenol A novolac resin. Of them, novolac epoxy resins (glycidyl ether of cresol novolac resin, glycidyl ether of phenol novolac resin and the like) are preferred because their cured products have a high crosslinking density and the adhesion strength can be increased upon heating of the film. These may be used alone or in combination of two or more.

Examples of epoxy resin curing agents include phenol compounds, aliphatic amines, alicyclic amines, aromatic polyamines, polyamides, aliphatic acid anhydrides, alicyclic acid anhydrides, aromatic acid anhydrides, dicyandiamides, organic acid dihydrazides, boron trifluoride amine complexes, imidazoles and tertiary amines. Of them, phenol compounds are preferred, and phenol compounds having two or more phenolic hydroxyl groups are particularly preferred. More specifically, naphthol novolac resin and trisphenol novolac resin are preferred. Using these phenol compounds as an epoxy resin curing agent makes it possible to effectively reduce contamination on chip surfaces and devices upon heating for package assembly and the generation of outgas that causes odor.

The tensile properties of the adhesive film for a semiconductor can be controlled by adjusting the content of filler. The higher the content of filler, the smaller the tensile elongation at break may be and the smaller the ratio of the tensile elongation at break to the elongation at the maximum load may be. Also, using an appropriate amount of filler can produce advantages of improving handling properties and thermal conductivity, adjusting melt viscosity and achieving thixotropic properties.

For the above purposes, the filler is preferably an inorganic filler. More specifically, an inorganic filler containing at least one inorganic material selected from the group consisting of aluminum hydroxide, magnesium hydroxide, calcium carbonate, magnesium carbonate, calcium silicate, magnesium silicate, calcium oxide, magnesium oxide, alumina, aluminum nitride, aluminum borate whiskers, boron nitride, crystalline silica, amorphous silica and antimony oxide is preferred. Of them, to improve thermal conductivity, alumina, aluminum nitride, boron nitride, crystalline silica and amorphous silica are preferred. For the purpose of adjusting melt viscosity and achieving thixotropic properties, aluminum hydroxide, magnesium hydroxide, calcium carbonate, magnesium carbonate, calcium silicate, magnesium silicate, calcium oxide, magnesium oxide, alumina, crystalline silica and amorphous silica are preferred. Also, to improve moisture resistance, alumina, silica, aluminum hydroxide and antimony oxide are preferred. A plurality of fillers may be used in combination.

The higher the content of the filler, the smaller the tensile elongation at break and the higher the strength at break may be due to an increased elastic modulus, and the lower the reflow crack resistance may be due to a decrease in adhesiveness. In particular, breaking may easily occur between an adherend such as an organic substrate having irregularities on the surface and a semiconductor chip upon reflow. Also, a higher content of filler may cause a decrease in the resistance in a reliability test in high-temperature high-humidity environment such as a HAST test. A higher content of filler may also increase the temperature at which an adhesive film for a semiconductor can be attached to a semiconductor wafer. In view of the above situation, the content of the filler is preferably less than 30% by mass, more preferably less than 25% by mass, and further preferably less than 20% by mass based on the total mass of the adhesive film for a semiconductor.

It is preferred that the adhesive film 8 for a semiconductor can be attached to the adherend semiconductor wafer at a temperature of 100° C. or lower. If the peel strength at the interface between an adhesive film for a semiconductor and a semiconductor wafer is 20 N/m or more when the adhesive film for a semiconductor kept at a predetermined temperature is attached to the semiconductor wafer, the adhesive film for a semiconductor is considered to be attachable to the semiconductor wafer. The adhesive film for a semiconductor is attached to a semiconductor wafer using, for example, a hot roll laminator set at a temperature of 100° C. or lower. The peel strength is measured in an atmosphere of 25° C. at a tensile angle of 90° and a tensile rate of 50 mm/minute. An adhesive film for a semiconductor which can be attached to a semiconductor wafer at 100° C. or lower can be prepared by, for example, reducing the content of the filler or using a thermoplastic resin having a low Tg. The temperature at which an adhesive film 8 for a semiconductor can be attached to a semiconductor wafer is preferably 95° C. or lower, more preferably 90° C. or lower. In consideration of the heat resistance of the back grind tape, the adhesive film 8 for a semiconductor can be attached to the adherend semiconductor wafer at a temperature of preferably 80° C. or lower.

The adhesive film 8 for a semiconductor preferably has heat resistance and humidity resistance required when mounting a semiconductor chip on a semiconductor chip mounting support member. To this end, it is preferred that the adhesive film 8 for a semiconductor has passed a reflow crack resistance test. The reflow crack resistance of the adhesive film for a semiconductor can be evaluated based on adhesion strength. To achieve good reflow crack resistance, the peel strength when bonding an adhesive film for a semiconductor to a semiconductor wafer at an adhesion area of 4×2 mm is preferably 1.0 kg/cm or more at an initial stage and 0.5 kg/cm or more after allowing to stand in an atmosphere at 85° C./85% for 48 hours. The initial peel strength is more preferably 1.3 kg/cm or more, and further preferably 1.5 kg/cm. The peel strength after allowing to stand in an atmosphere at 85° C./85% for 48 hours is more preferably 0.7 kg/cm or more, and further preferably 0.8 kg/cm or more.

The adhesive film 8 for a semiconductor may be prepared by a method in which a coating solution containing a high molecular weight component such as a thermoplastic resin, a thermosetting component, a filler and an organic solvent in which they are dissolved or dispersed is applied to a base film, and the organic solvent is removed from the coating solution on the base film by heating.

Organic solvents are not particularly limited as long as materials can be homogeneously dissolved or dispersed in them. Examples thereof include dimethylformamide, dimethylacetamide, N-methylpyrrolidone, dimethyl sulfoxide, diethylene glycol dimethyl ether, toluene, benzene, xylene, methyl ethyl ketone, tetrahydrofuran, ethyl cellosolve, ethyl cellosolve acetate, butyl cellosolve, dioxane, cyclohexanone and ethyl acetate. These may be used alone or in combination of two or more.

Base films are not particularly limited as long as they can withstand heating for removing organic solvents. Examples of base films include polyester films, polypropylene films, polyethylene terephthalate films, polyimide films, polyetherimide films, polyether naphthalate films and methyl pentene films. Multilayer films composed of two or more of these films in combination may also be used as a base film. The surface of the base film may be treated with a silicone or silica release agent. After removing the organic solvent, the base film may not be removed but used as a support for an adhesive film for a semiconductor.

The adhesive film for a semiconductor may be preserved or used in the form of a composite sheet with a dicing tape laminated thereon. Using such a composite sheet makes it possible to simplify the process of producing semiconductor devices.

The adhesive film for a semiconductor used in the method for producing a semiconductor chip with an adhesive film of the present invention may be those prepared as a die bonding film having the following structure.

(a) A die bonding film composed of a base material and an adhesive layer containing a thermosetting resin and/or a thermoplastic resin in that order.

(b) A die bonding film composed of a base material, a pressure-sensitive adhesive layer and an adhesive layer containing a thermosetting resin and/or a thermoplastic resin in that order.

(c) A die bonding film composed of a base material and a pressure-sensitive adhesive/adhesive layer containing a thermosetting resin and/or a thermoplastic resin in that order.

The adhesive layers of the die bonding films (a) and (b) and the pressure-sensitive adhesive/adhesive layer of the die bonding film (c) correspond to the adhesive film for a semiconductor according to the present invention.

When using the die bonding film (a), a laminate according to the present invention can be prepared by either of the following methods.

(1) First, the adhesive layer of the above-described die bonding film (a) and a semiconductor wafer are laminated. Secondly, the base material of the die bonding film is peeled off. And then a pressure-sensitive adhesive layer of a dicing tape material having the pressure-sensitive adhesive layer and a base material in that order is laminated on the adhesive layer.

(2) First, the adhesive layer of the above-described die bonding film (a) and a pressure-sensitive adhesive layer of a dicing tape material having the pressure-sensitive adhesive layer and a base material in that order are laminated. And then the base material of the die bonding film is peeled off and the adhesive layer and a semiconductor wafer are laminated.

When using the die bonding film (b), a laminate according to the present invention can be prepared by the following method.

(3) The adhesive layer of the above-described die bonding film (b) and a semiconductor wafer are laminated. A laminate can be prepared by this procedure when the base material and the pressure-sensitive adhesive layer function as a dicing tape. A laminate may also be prepared by laminating a dicing tape on the pressure-sensitive adhesive layer after peeling off the base material.

When using the die bonding film (c), a laminate according to the present invention can be prepared by the following method.

(4) First, the pressure-sensitive adhesive/adhesive layer of the above-described die bonding film (c) and a semiconductor wafer are laminated. A laminate can be prepared by this procedure when the base material functions as a dicing tape. A laminate may also be prepared by laminating a dicing tape on the pressure-sensitive adhesive layer after peeling off the base material.

As described in the example of using the above-described die bonding film (c), the present invention can also provide a method for producing a semiconductor chip with an adhesive film comprising steps of: preparing a laminate in which at least a divided semiconductor wafer comprising a plurality of semiconductor chips, obtained by forming a cut which separates the semiconductor wafer into a plurality of semiconductor chips on one side of the semiconductor wafer in a thickness less than that of the semiconductor wafer and by grinding the other side of the semiconductor wafer on which no cut is formed to reach the cut, a film-form pressure-sensitive adhesive/adhesive and a base material are laminated, the film-form pressure-sensitive adhesive/adhesive having a thickness in the range of 1 to 15 µm and a tensile elongation at break of less than 5%, and the tensile elongation at break being less than 110% of the elongation at a maximum load; and dividing the film-form pressure-sensitive adhesive/adhesive by picking up the plurality of semiconductor chips in a laminating direction of the laminate, thereby preparing a semiconductor chip with an adhesive film. For the above-described base material, a material which functions as a dicing tape may be used.

Although this embodiment has illustrated a case where the adhesive film for a semiconductor according to the present invention is disposed on the back side of a semiconductor wafer, the method for producing a semiconductor chip with an adhesive film of the present invention can also be applied to a process in which an adhesive film for a semiconductor is attached to the circuit side of a semiconductor wafer.

The semiconductor chip 30 with an adhesive film prepared by the method according to this embodiment as described above constitutes a semiconductor element such as an IC and an LSI. The semiconductor chip 30 with an adhesive film is bonded to another semiconductor chip or a semiconductor chip mounting support member via the adhesive film 8a.

Examples of semiconductor chip mounting support members include lead frames such as 42 alloy lead frames and copper lead frames, a resin film composed of an epoxy resin, a polyimide resin or a maleimide resin, substrates prepared by impregnating nonwoven glass fabric or woven glass fabric with a thermosetting resin such as an epoxy resin, a polyimide resin or a maleimide resin and curing the resultant, and glass substrates and ceramic substrates such as alumina.

Figure 6:
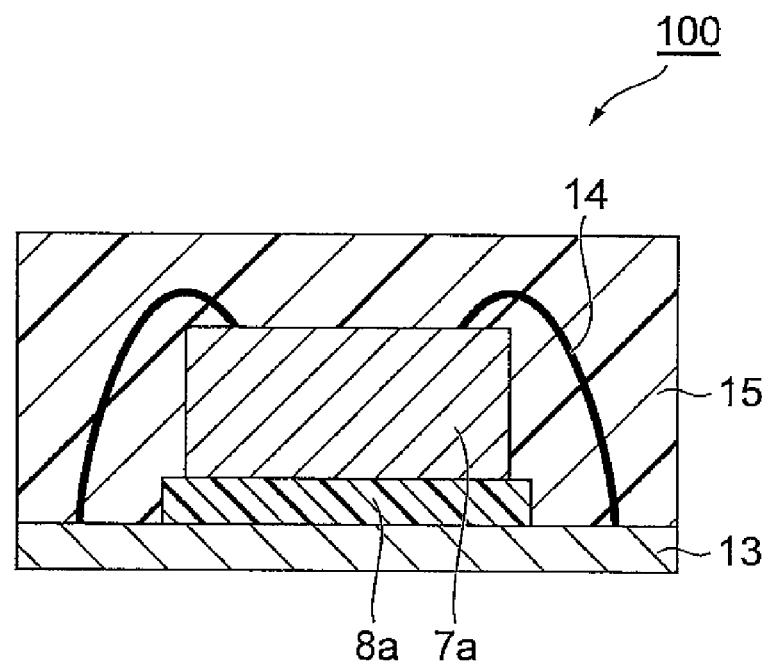
FIG. 6 is a cross-sectional view illustrating an embodiment of a semiconductor device.

FIG. 6 is a cross-sectional view illustrating an embodiment of a semiconductor device prepared by the above method. A semiconductor device 100 shown in FIG. 6 has a wiring board (support member) 13 and the semiconductor chip 7a bonded to the wiring board 13 via the adhesive film 8a. The semiconductor chip 7a is connected to the wiring of the wiring board 13 by means of a binding wire 14. The semiconductor chip 7a is sealed by a sealing resin layer 15 in which the chips are embedded.

A semiconductor chip and a support member, or semiconductor chips with each other, are bonded by heating at 60 to 300° C. for 0.1 to 300 seconds with an adhesive film for a semiconductor interposed between the semiconductor chip and the support member or between the semiconductor chips.

When the adhesive film 8 for a semiconductor contains a thermosetting resin, the semiconductor chip after bonding is preferably heated to facilitate adhesion of the adhesive film for a semiconductor to an adherend or its curing, so as to increase the strength of the bond. Heating conditions may be adjusted based on the composition of the adhesive film, and the semiconductor chip is heated generally at 60 to 220° C. for 0.1 to 600 minutes. When sealed with a resin, the heating in the step of curing the sealing resin may be utilized.

EXAMPLES

In the following, the present invention will be described in more detail by means of Examples. However, the present invention is not limited thereto.

Preparation of Adhesive Film for Semiconductor

Example 1

A 500 ml four-neck flask equipped with a thermometer, a stirrer and a calcium chloride drying tube was charged with diamines, i.e., 1,3-bis(3-aminopropyl)tetramethyldisiloxane (0.06 mol) and 4,9-dioxadecane-1,12-diamine (0.04 mol), and 150 g of N-methyl-2-pyrrolidone as a solvent, and the mixture was stirred at 60° C. to dissolve diamines.

After dissolving diamines, 1,10-(decamethylene)bis(trimellitate dianhydride) (0.02 mol) and 4,4'-oxydiphthalic acid dianhydride (0.08 mol) were added thereto in small portions and the mixture was allowed to react at 60° C. for 3 hours. Then the mixture was heated at 170° C. while blowing $N_2$ gas thereinto to remove water in the system with some of the solvent by azeotropic distillation over 3 hours. A polyimide resin solution was prepared in this way.

To an NMP solution of the polyimide resin prepared above (containing 100 parts by mass of polyimide resin) were added 4 parts by mass of cresol novolac epoxy resin (available from Tohto Kasei Co., Ltd.), 2 parts by mass of 4,4'-[1-[4-[1-(4-hydroxyphenyl)-1-methylethyl]phenyl]ethylidene]bisphenol (available from Honshu Chemical Industry Co., Ltd.) and 0.5 part by mass of tetraphenylphosphonium tetraphenylborate (available from Tokyo Chemical Industry, Co., Ltd.). Further, 12% by mass of a boron nitride filler (available from MIZUSHIMA FERROALLOY CO., LTD.) and 3% by mass of Aerosil filler R972 (available from Nippon Aerosil Co., Ltd.) were added thereto based on the total solid weight, and the mixture was sufficiently kneaded to give a varnish.

The varnish prepared was applied to a release-treated polyethylene terephthalate film (film A31 having a thickness of 50 µm available from Teijin DuPont Films Japan Limited) and the resultant was heated at 80° C. for 30 minutes and then at 120° C. for 30 minutes to give an adhesive film for a semiconductor having a thickness of 5 µm.

Example 2

A varnish prepared in the same manner as in Example 1 was applied to a release-treated polyethylene terephthalate film (film A31 having a thickness of 50 µm available from Teijin DuPont Films Japan Limited) and the resultant was heated at 80° C. for 30 minutes and then at 120° C. for 30 minutes to give an adhesive film for a semiconductor having a thickness of 15 µm.

Comparative Example 1

A varnish prepared in the same manner as in Example 1 was applied to a release-treated polyethylene terephthalate film (film A31 having a thickness of 50 µm available from Teijin DuPont Films Japan Limited) and the resultant was heated at 80° C. for 30 minutes and then at 120° C. for 30 minutes to give an adhesive film for a semiconductor having a thickness of 25 µm.

Comparative Example 2

DF-402 (available from Hitachi Chemical Co., Ltd., trade name, thickness: 15 µm) was prepared as an adhesive film for a semiconductor of Comparative Example 2.

<Evaluation of Adhesive Film>
(Maximum Stress, Elongation at Maximum Load and Tensile Elongation at Break)

A tensile test was performed using a strip test piece (having a width of 5 mm and a length of 50 mm) cut from a B-stage adhesive film. The maximum stress, elongation at the maximum load and tensile elongation at break were calculated from the stress-strain curve obtained based on the following calculation formulas. The tensile test was performed using a tensile tester (100N Autograph AGS-100NH made by Shimadzu Corporation) in an atmosphere of 25° C. under the conditions of a chuck distance at the start of the test of 30 mm and a tensile rate of 5 mm/minute.

Maximum stress (Pa)=maximum load (N)/cross sectional area ($m^2$) of sample

Elongation at maximum load (%)={(chuck distance (mm) at maximum load−30)/30}×100

Tensile elongation at break (%)={(chuck distance (mm) at break−30)/30}×100

<Preparation of Semiconductor Chip with Adhesive Film>

A 50 μm-thick semiconductor wafer (material: single crystalline silicon) was divided into semiconductor chips having a thickness of 50 μm and a size of 10 mm×10 mm by means of the dicing-before-grinding shown in FIGS. 1 and 2.

At the same time, the adhesive films for a semiconductor prepared in Examples and Comparative Examples were each cut out into a circle having a diameter of 210 mm, and the resulting adhesive films for a semiconductor were each laminated on a dicing tape (available from DENKI KAGAKU KOGYO KABUSHIKI KAISHA, trade name "AD-80H", thickness: 80 μm) using a wafer mounter "DM-300H" (made by JCM Co., Ltd., trade name) under the conditions of room temperature, a linear pressure of 5 kgf and 10 mm/s to give a laminated product of the adhesive film for a semiconductor and the dicing tape. A wafer ring was also attached to the dicing tape of the laminated product.

The above-described laminated product of the adhesive film for a semiconductor and the dicing tape was attached to the back side of the above-described divided semiconductor wafer which had been subjected to dicing-before-grinding using a wafer mounter "DM-300H" (made by JCM Co., Ltd., trade name) under the conditions of a hot plate temperature of 80° C., a linear pressure of 5 kgf and 3 mm/s to prepare a sample laminate.

The sample laminate prepared above was set on flexible die bonder "DB-730" (made by Renesas Eastern Japan Semiconductor, Inc., trade name) and the dicing tape was expanded by the expanding device. The rate of expansion was 10 mm/s and the amount of expansion was 4 mm. Then, the semiconductor chips in the expanded sample laminate were picked up using the multi-pin push-up jig of flexible bonder "DB-730" (made by Renesas Eastern Japan Semiconductor, Inc.) in which 9 ejector needles (made by Micro-Mechanics Pte Ltd., SEN-83-05, needle diameter: 0.7 mm, tip: semicircular, 350 μm in diameter) are arranged in a grid pattern at an interval of 4.2 mm while pushing up the needles and using a rubber chip (made by Micro-Mechanics Pte Ltd., trade name: 13-087E-33, 10 mm×10 mm) as a pick-up collet. Here the semiconductor chips were picked up while pushing up the needles in two stages; they were pushed up under the conditions of a push-up height of 300 μm and a push-up rate of 89.4 mm/s in the first stage, and under the conditions of a push-up height of 1,500 μm and a push-up rate of 8.94 mm/s in the second stage for a holding time after pushing up (pick-up time) of 500 ms. Pick-up properties in this experiment were evaluated based on the following criteria.

[Pick-Up Properties]

A: The adhesive film for a semiconductor could be cut and the semiconductor chips with an adhesive film were successfully picked up.

B: The adhesive film for a semiconductor could not be completely cut, making it impossible to pick up the semiconductor chips and causing chip cracks.

TABLE 1

| | | Unit | Example 1 | Example 2 | Comparative Example 1 | Comparative Example 2 |
|---|---|---|---|---|---|---|
| Tensile properties | Maximum stress | MPa | 45.9 | 45.9 | 45.9 | 60.0 |
| | Elongation at maximum load | % | 2.5 | 2.5 | 2.5 | 3.9 |
| | Tensile elongation at break | % | 2.5 | 2.5 | 2.5 | 10.3 |
| | Tensile elongation at break/elongation at maximum load | % | 101 | 101 | 101 | 264 |
| | Film thickness | μm | 5 | 15 | 25 | 15 |
| | Pick-up properties | — | A | A | B | B |

As Table 1 shows, it has been proved that when using the adhesive films for a semiconductor of Examples 1 and 2 having a thickness in the range of 1 to 15 μm and a tensile elongation at break of less than 5%, and in which the tensile elongation at break is less than 110% of the elongation at the maximum load, the adhesive films for a semiconductor could be divided in the above-described pick-up step, making it possible to prepare semiconductor chips with an adhesive film. It has also been found that flash in the divided adhesive films was sufficiently reduced and the divided adhesive films had substantially the same shape as that of the semiconductor chip. On the other hand, when the adhesive films for a semiconductor of Comparative Examples 1 and 2 were used, the adhesive films for a semiconductor could not be divided in the above-described expansion step or pick-up step.

The above results have proved that the method for producing a semiconductor chip with an adhesive film using an adhesive film for a semiconductor of the present invention is capable of producing a semiconductor chip with an adhesive film laminated thereon in which flash is sufficiently little and which has substantially the same shape as that of the semiconductor chip, and capable of achieving both assembling properties and reliability in a method of producing a semiconductor device based on a dicing-before-grinding process.

INDUSTRIAL APPLICABILITY

The present invention can provide a method for producing a semiconductor chip with an adhesive film, capable of producing a semiconductor chip from a semiconductor wafer at a good yield and capable of producing a semiconductor chip with an adhesive film laminated thereon in which flash is sufficiently little and which has substantially the same shape as that of the semiconductor chip, an adhesive film for a semiconductor suitably used in the method for producing a semiconductor chip with an adhesive film and a method for producing a semiconductor device capable of achieving both assembling properties and reliability.

The invention claimed is:

1. A method for producing a semiconductor chip with an adhesive film comprising steps of:

preparing a laminate in which at least a divided semiconductor wafer comprising a plurality of semiconductor chips, obtained by forming a cut which separates the semiconductor wafer into a plurality of semiconductor chips on one side of the semiconductor wafer in a thickness less than that of the semiconductor wafer and by grinding the other side of the semiconductor wafer on which no cut is formed to reach the cut, an adhesive film for a semiconductor and a dicing tape are laminated, the adhesive film for a semiconductor having a thickness in the range of 1 to 15 μm and a tensile elongation at break of less than 5%, and the tensile elongation at break being less than 110% of the elongation at a maximum load; and dividing the adhesive film for a semiconductor by applying a shearing force thereto, which is generated when picking up the plurality of semiconductor chips in a laminating direction of the laminate, thereby preparing a semiconductor chip with an adhesive film, said preparing said laminate including attaching the adhesive film for the semiconductor and the dicing tape in that order to the back side of the divided semiconductor wafer, or attaching a composite sheet of said adhesive film and said dicing tape to the back side of the divided semiconductor wafer in such a direction that the adhesive film for the semiconductor is between the back side of the divided semiconductor wafer and the dicing tape.

2. The method for producing a semiconductor chip according to claim 1, including the further step of preparing the divided semiconductor wafer comprising the plurality of semiconductor chips, by forming the cut which separates the semiconductor wafer into the plurality of semiconductor chips on one side of the semiconductor wafer in a thickness less than that of the semiconductor wafer and by grinding the other side of the semiconductor wafer on which no cut is formed, to reach the cut.

3. The method for producing a semiconductor chip according to claim 1, wherein said tensile elongation at break is less than 3.5%, and said tensile elongation at break is less than 105% of the elongation at the maximum load.

4. The method for producing a semiconductor chip according to claim 1, wherein said adhesive film has a thickness of 5 to 15 μm.

5. The method for producing a semiconductor chip according to claim 1, wherein the adhesive film comprises a high molecular weight component, a thermosetting component and a filler.

6. The method for producing a semiconductor chip according to claim 5, wherein said high molecular weight component is a thermoplastic resin, and said thermosetting component includes a thermosetting resin.

7. The method for producing a semiconductor chip according to claim 6, wherein said thermoplastic resin is a polyimide resin, and said thermosetting resin is an epoxy resin.

8. The method for producing a semiconductor chip according to claim 5, wherein said filler is included in the adhesive film in an amount of less than 30% by mass, based on the total mass of said adhesive film.

\* \* \* \* \*